United States Patent [19]

Shahryar

[11] Patent Number: 5,258,077
[45] Date of Patent: Nov. 2, 1993

[54] HIGH EFFICIENCY SILICON SOLAR CELLS AND METHOD OF FABRICATION

[75] Inventor: Ishaq Shahryar, Pacific Palisades, Calif.

[73] Assignee: Solec International, Inc., Hawthorne, Calif.

[21] Appl. No.: 760,079

[22] Filed: Sep. 13, 1991

[51] Int. Cl.$^5$ .................... H01L 31/06; H01L 31/18
[52] U.S. Cl. .................... 136/256; 136/261; 437/2
[58] Field of Search .................... 437/2-5; 136/256, 261

[56] References Cited

U.S. PATENT DOCUMENTS

| | | | |
|---|---|---|---|
| 3,015,590 | 1/1962 | Fuller | 136/256 X |
| 4,158,591 | 6/1979 | Avery et al. | 156/643 |
| 4,726,850 | 2/1988 | Wenham et al. | 136/256 |

OTHER PUBLICATIONS

C. M. Chong et al, *Appl. Phys. Lett.*, vol. 52, No. 5, Feb. 1988, pp. 407–409.
M. A. Green et al, *Conference Record, 20th IEEE Photovoltaic Specialists Conference* (1988), pp. 411–414.

*Primary Examiner*—Aaron Weisstuch
*Attorney, Agent, or Firm*—Blakely, Sokoloff, Taylor & Zafman

[57] ABSTRACT

A very inexpensive, uncomplicated, and high throughput manufacturing process for fabrication of high efficiency silicon solar cells is disclosed. The manufacturing process begins with a low resistivity Czochralski wafer. Then the wafer's front surface is texturized and a lightly doped N type junction is formed in the front surface. Next, silicon dioxide is thermally grown on the wafer's front and back surfaces. Then a computer driven laser beam cuts the front surface oxide to form the grooves needed for the fabrication of the topside electrical contacts. The next step is to diffuse phosphorus deeply in the silicon under the groove areas, where the oxide has been eliminated by the laser beam. Thereafter, electroless plating of gold, nickel and copper in the groove areas is performed to form the topside ohmic contacts. Subsequently, junction edges at the wafer edges are plasma etched to remove any electrical shunts. Finally, rear ohmic contacts are screen printed and sintered.

11 Claims, 2 Drawing Sheets

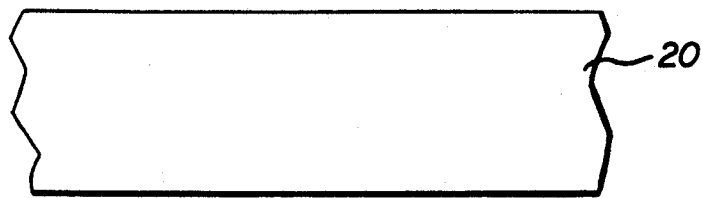
FIG. 1
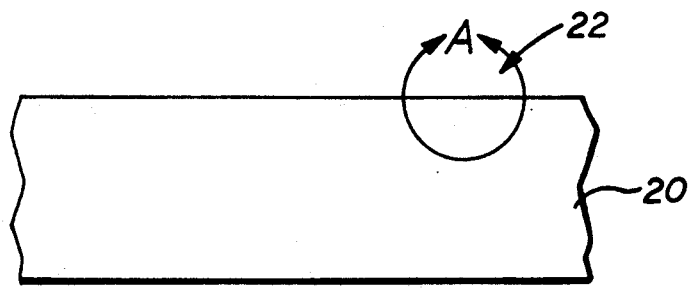 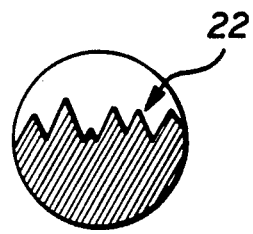
FIG. 2  FIG. 2A
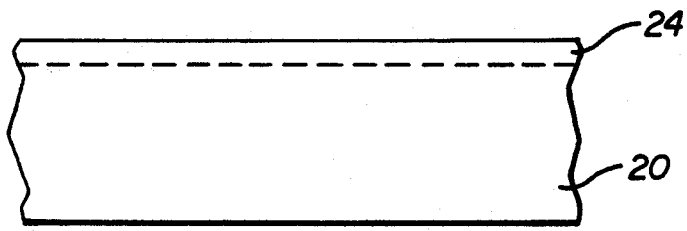
FIG. 3
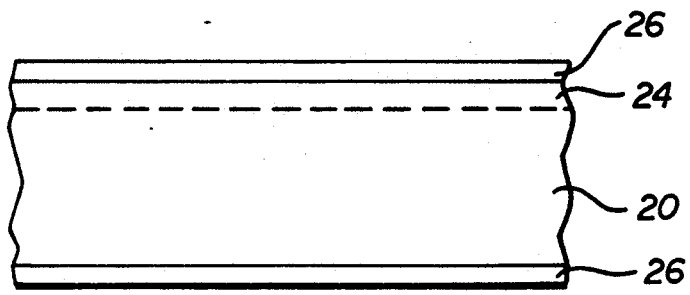
FIG. 4

HIGH EFFICIENCY SILICON SOLAR CELLS AND METHOD OF FABRICATION

BACKGROUND OF THE INVENTION

1. Field of the Invention

The present invention relates to solar cells. More particularly, the present invention relates to techniques for inexpensive manufacturing and fabrication of high efficiency silicon solar cells using uncomplicated high throughput processes.

2Description of the Prior Art

Semiconductor solar cells are used to convert light energy to electrical energy. Typically, a silicon solar cell consists of a P-N junction. Upon impact of photons in the solar spectrum with the semiconductor, the energy of some of such photons generates electron-hole pairs in the semiconductor. These electron-hole pairs traverse the semiconductor's length and cause a potential difference across the semiconductor and a current in a load connected thereto.

Various techniques for manufacturing and fabricating semiconductive silicon solar cells are known in the prior art. One goal of fabrication of silicon solar cells is to achieve a high efficiency in the conversion of the photon energy to electrical energy. Efficiencies as high as 18% to 20% have been reached in production environments. Another goal of manufacturing silicon solar cells is to reduce the complexity of fabrication, thereby achieving lower costs and higher throughputs. Yet another objective in the production of silicon solar cells is to increase the total energy output while reducing the area of the silicon cell, thereby achieving a lower cost, a lower size and a lower weight. Manifestly, these objectives are often conflicting.

The prior art has attempted to reach some of the aforementioned objectives by utilization of various process techniques. These attempts, however, have not been successful in reaching high efficiency, high throughput and inexpensive solar cells. One reason for this shortcoming is that the prior art has always aimed at perfecting a process step to achieve high efficiency solar cells, usually at the expense of complicating the technology, in turn resulting in expensive and low throughput manufacturing. For example, some prior art techniques have focused on the reduction of electrical interconnect area atop a solar cell in order to reduce the amount of light blocked by such interconnect. Efforts to achieve this goal by "laser punching" (wherein a hole is laser punched in the semiconductor body of a series of adjacent cells and the interconnect is routed through the common hole) have proved to be expensive, and inefficient. As another example, some prior art solar cells have their interconnect on the rear surface of the cell, thus avoiding shading of the front surface. However, the use of masking technology and evaporating metals to form the desired complicated pattern of contacts on the rear surface is both inefficient and expensive.

Another prior art technique to lower the cost of solar cells is to reduce the semiconductor substrate thickness. However, if the thickness of the semiconductor substrate drops below the diffusion length of the minority carriers the recombination of the minority carriers at the rear surface ohmic contact would be increased, in turn resulting in a reduction in the efficiency of the cell. This reduction of efficiency problem was later addressed by creating a potential barrier for the minority charge carriers at the back surface so that the carriers cannot reach the rear surface ohmic contact. This potential barrier was created by diffusion or ion implantation of sufficient impurity atoms in the rear surface of the solar cell. However, the diffusion or ion implantation of impurity atoms in the back surface of the solar cell is complicated, expensive and creates defects at the back surface.

Furthermore, the thinness of solar cells is limited by concerns other than the reduction of efficiency or complicated manufacturing discussed above. Namely, solar cells may get to be too thin to be practical since their brittleness makes it very difficult to attach external electrical contacts on the cells. Moreover, for solar cells that are too thin, some low efficiency still persists due to the poor quality of the thin substrate produced by deposition of the thin semiconductor material on a foreign substance. Thin cells also demonstrate stability problems caused by the chemical reaction of the semiconductor with the ambient (such as oxygen or water).

As a further example, the prior art has utilized very complicated and costly patterning technology to form precise pyramid surface structures to attain "texturized" surfaces in order to reduce the reflectivity of the front surface of solar cells. The improvement in the efficiency of the cells fabricated by this precise texturizing technique may be achieved by less costly methods.

There therefore exists a need for a less complicated, less expensive and higher throughput manufacturing of high efficiency silicon solar cells. The purpose of the present invention is to fulfill this need.

BRIEF SUMMARY OF THE INVENTION

A very inexpensive, uncomplicated, and high throughput manufacturing process for fabrication of high efficiency silicon solar cells is disclosed. The manufacturing process begins with a low resistivity Czochralski wafer. Then the substrate's front surface is texturized and a lightly doped N type junction is formed in the front surface. Next, silicon dioxide is thermally grown on the substrate's front and back surfaces. Then a computer driven laser beam cuts the front surface oxide to form the grooves needed for the fabrication of the topside electrical contacts. The next step is to diffuse phosphorus deeply in the silicon under the groove areas, where the oxide has been eliminated by the laser beam. Thereafter, electroless plating of gold, nickel and copper in the groove areas is performed to form the topside ohmic contacts. Subsequently, junction edges at the wafer edges are plasma etched to remove any electrical shunts. Finally, rear ohmic contacts are screen printed and sintered.

BRIEF DESCRIPTION OF THE DRAWINGS

FIG. 1 shows a P type CZ wafer upon which the solar cells are fabricated.

FIG. 2 magnifies the surface of the silicon wafer after it is texturized to reduce the reflectivity of the bare silicon.

FIG. 3 shows the formation of a layer of light phosphorus diffusion under the texturized surface of the silicon.

FIG. 4 depicts the thermally grown oxide on both the front and rear surfaces of the silicon wafer.

DETAILED DESCRIPTION OF THE INVENTION

Figure 5:
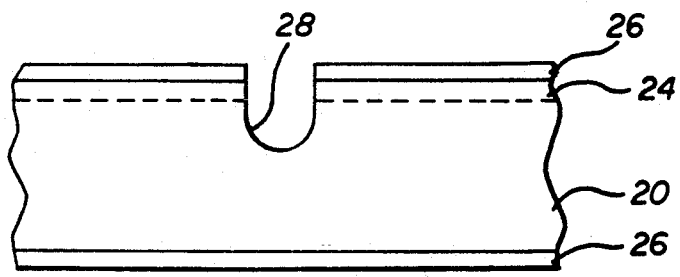
FIG. 5 is a schematic of a laser cut groove on a typical cell on the silicon wafer.

First, referring to FIG. 1, the fabrication of the solar cell in accordance with the present invention begins with a wafer 20 produced by the Czochralski method (the wafer so produced is commonly called a CZ wafer). Large area CZ wafers with resistivity of 1 to 30 ohm-cm are readily available at low cost. The present invention avoids the use of the higher purity, but much more expensive, float zone wafer (commonly called an FZ wafer). The additional light to electricity conversion efficiency gained by using the more expensive FZ wafers can be obtained by less expensive process improvements of the present invention. Nevertheless, all the process steps disclosed by the present invention may, of course, be performed on an FZ wafer as well.

Now referring to FIG. 2, window 22 shows an enlarged view of the irregular texturized front surface of the solar cell of the present invention. This texturized surface is produced by anisotropic etching of <100>-oriented silicon surface. Light incident on the side of a pyramid formed by the texturizing process will be reflected onto another pyramid instead of being lost. Unlike the prior art, the present invention does not strive to form precise pyramids on the surface of the silicon since the reduction of reflectivity of silicon from 35% (the ratio of the reflected light to the total incident light) to around 20% even for irregular texturized surfaces diminishes the benefit of accurate pyramid formation in view of the substantial additional costs thereof. Also, some prior art methods avoid texturizing the front surface altogether and rely solely on antireflection coating of that surface. However, the low cost of irregular texturizing of the front surface is a small price to pay for the resulting loss of reflectivity (from 35% to 20%) of silicon.

The next step is to form an N type layer 24 by a light diffusion of impurity atoms near the top surface of the silicon as shown in FIG. 3. This light diffusion is accomplished in two steps. The first step is a predeposit (also called a "constant source") step. In this step silicon wafers are placed in a quartz carrier and the wafers are heated to approximately 950° C. Impurity atoms are then carried by an inert gas to the surface of the silicon wafers. The N type impurity atoms used in the present solar cell are usually phosphorus atoms, although other donor type impurity atoms may be used as well. Thus, during the predeposit step impurity atoms, for example phosphorus atoms, are deposited on the surface of the silicon wafers, and the atoms are dissolved in the silicon, and begin to diffuse into the silicon wafers.

The second step is the drive-in (also called a "limited source") step. In this step the temperature of the silicon wafers is increased to approximately 1100° C. and a gas stream of oxygen or steam is passed over the heated wafers. During the drive-in step the impurity atoms which were predeposited in the first step are further diffused into the heated silicon wafer to produced a junction of desired depth below the surface. Also, during this step a layer of $SiO_2$, as shown by layer 26 in FIG. 4, grows on both the front and the back surfaces of the silicon. The oxide grown on the front surface is used for passivation of the silicon surface, but the oxide that grows on the back surface as a by-product of the drive-in procedure is superfluous and will be removed in a later process step. The growth of oxide on the front surface prevents the escape of the previously deposited phosphorus atoms back into the atmosphere. During this step the total number of the impurity atoms neither increases nor decreases, therefore a redistribution of the impurity atoms takes place during this step. This redistribution results in a gradually decreasing concentration of the impurity atoms, thus forming a lightly doped junction below the front surface of the silicon wafer and down to a desired depth. A low junction depth (about 0.3 microns) is desired since a shallow junction will improve the response of the solar cell to light energy.

It is noted that both the diffusion and oxide growth are performed at low cost and with relative simplicity in accordance to the present invention. For example, the diffusion step utilizes a low cost furnace which is less expensive than a complex ion implantation scheme. Similarly, the oxide growth step is performed in the same furnace where the diffusion was performed by using a readily available modified gas supply system that provides the oxidizing atmosphere. However, some prior art has used a chemical vapor deposited oxide (CVD oxide) process. Although CVD oxide is of lower quality, more complicated and more costly to fabricate than the thermally grown oxide, the prior art has utilized the CVD technique to form the oxide over metal layers which have a low melting point. Also, some prior art has used CVD oxide since it is less chemically resistant and easier to remove. For example, one prior art process has used the CVD oxide essentially as an etching mask to form topside contact mesas. Later, this CVD oxide is entirely removed and a uniform layer of thermal oxide is grown following a diffusion step. The present invention obviates the need for CVD oxide since for example, no oxide layer is required after the metal layers have been fabricated.

The next step is laser cutting of the grid grooves 28 shown in FIG. 5. Prior art processes use the more expensive masking and acid etching technology for formation of the grooves for the topside contacts. The present invention, however, uses a rapid throughput computer controlled laser equipment that is able to cut very fine (about 25 microns wide) slots through the thermally grown oxide layer and down into the silicon for the desired depth of about 25 to 50 microns. If the laser beam is properly tuned and focused the cuts may be sufficiently clean to proceed without further cleaning of the groove area. However, inexpensive ultrasonic techniques are available to clean the ash and debris left in the groove area after the laser beam operation. This cleaning procedure includes the simultaneous use of sodium hydroxide as the cleaning agent and ultrasonic vibrations induced in the groove area to loosen up, extract and wash away the left over debris. The grid grooves 28 perform the very important function of increasing the power output, in other words the light to electricity conversion efficiency, of the solar cell as described later.

Figure 6:
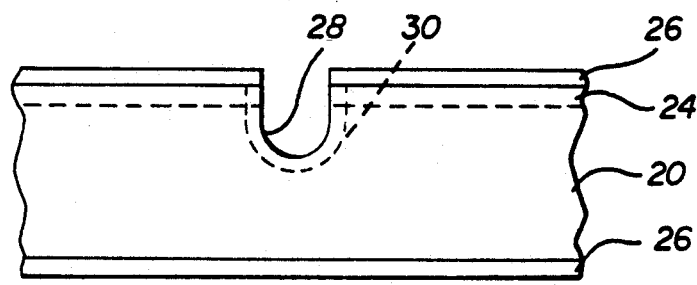
FIG. 6 is an illustration of deep phosphorus diffusion under the groove area.

The next step is the deep diffusion of impurity atoms in the groove areas, creating a heavily doped N type junction 30 under the grooves as illustrated in FIG. 6.

Like the light diffusion process described earlier, this diffusion is also performed by placing the wafers in a heated quartz chamber of a temperature of approximately 950° C. and passing over the heated wafers a stream of inert gas containing impurity atoms. Since the groove areas are not protected by silicon dioxide, the impurity atoms will settle on the surface of the silicon in the groove areas and begin to diffuse into the silicon. Since this process is carried on at high temperatures and for a long enough time, a heavily doped area under the grooves will be formed. Unlike the light doping technique described earlier, the heavy doping technique is performed only with a constant diffusion source, wherein the source of impurity atoms will not be limited by a later growth of thermal oxide. This heavily doped area creates a potential barrier for the minority carriers travelling toward the topside ohmic contact (which will be fabricated in the groove area in a later process step). The deflection of minority carriers due to this potential barrier results in a reduction of excess recombination of the minority carriers near the topside ohmic contact and this in turn increases the efficiency of the solar cell. Like the light doping process described earlier, the impurity atoms used for this heavy doping process are also usually phosphorus atoms, although other donor type impurity atoms may be used as well.

The next step is electroless plating of the ohmic contacts in the groove area. The electroless plating process is similar to electroplating process except that no outside current is needed to accomplish the electroless process. In the electroless plating process the metal ions are reduced by chemical agents in the plating solution and deposited onto the substrate. The chemical reduction process once initiated is autocatalytic. Deeply recessed areas which are difficult to plate can be coated by the electroless process. The present invention utilizes mostly gold, nickel, and copper for the electroless plating process. In any event, ohmic contacts formed by depostion of an underlayer of gold make a very strong electrical connection to the silicon substrate and have a high bonding strength. Thus, the laser cutting of the topside grooves and the electroless plating process avoid the need for expensive masking and metal evaporating process used in most prior art processes for contact formation.

Conventional topside contacts result in shadowing of the top surface of the solar cell and thus reduce the light to electricity conversion efficiency of the cell. To cure this problem, some prior art techniques use complicated patterning of both the N junction and the P junction contacts on the rear surface of the cell. This technique is too complicated and too expensive in view of the very small loss in the total power output of the solar cell using the topside contact designed in accordance with the present invention. Some other prior art processes use a CVD oxide to form mesas upon which the topside contacts is to be fabricated. The CVD oxide is later removed and an oxide layer is thermally grown on the top surface. Besides being expensive and complicated, this process still results in some shadowing of the top surface of the semiconductor.

Figure 7:
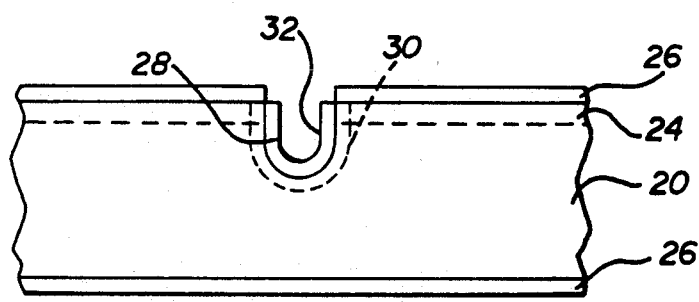
FIG. 7 shows the ohmic contact formed by the electroless plating of gold, nickel, and copper in the groove area.

In accordance with the present invention the topside contact 32 of FIG. 7 which is formed by the electroless plating process described above, is configured to leave a large active area of the semiconductor exposed to light. This configuration of the topside contact results in an increase in the total power output per unit area of the solar cell. nonetheless, the contact area is wide enough to allow for minimal $I^2 R$ loss. The $I^2 R$ heat loss in the topside ohmic contact can be further reduced by building thicker contacts by either electroplating or solder dipping to fill in the grooves. Electroplating is performed by introducing an electrode to the plating solution, thereby causing the metallic ions in the plating solution to be attracted and deposit in the groove area based on the electric field generated by the potential difference between the electrode and the ohmic contact. Because of the existence of an electrical current in the electroplating process, the depostion of ions in the groove area is accomplished at a faster rate than the electroless process and therefore more metal may be deposited. Alternatively, a solder dipping process may be utilized wherein a layer of molten tin gets deposited on the gold, nickel, and copper layers which are already a part of the basic topside contact structure. The improved current conduction accomplished through the elctroplating or the solder dipping process results in a lower $I^2 R$ heat loss and, in turn, in additional efficiency improvement of the solar cell. Thus, the contact fabrication process described herein is a high throughput and relatively inexpensive process which yields high quality ohmic contacts while increasing the light to electricity conversion efficiency of the solar cell.

Figure 8:
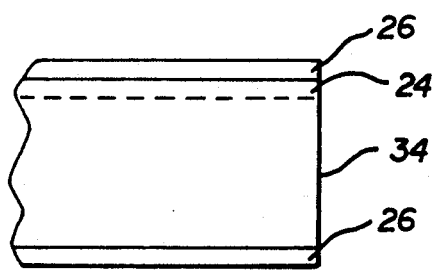
FIG. 8 illustrates the plasma etched edge of the solar cells fabricated at the very end of the silicon wafer.

The subsequent step is to clean the junction edges of the solar cells located at the edge of the silicon wafer. This cleaning is performed in order to remove any electrical shunts between the N and P type junctions which reduce the efficiency of the solar cell by reducing the open circuit voltage of the cell. FIG. 8 shows an edge 34 of a solar cell junction which has been cleaned by plasma etching in accordance with the present invention. The prior art utilized expensive masking and acid etching processes to accomplish the same objectives as the present invention.

Figure 9:
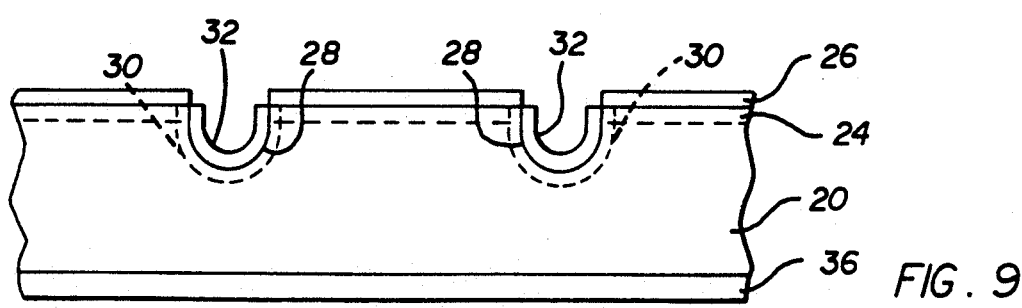
FIG. 9 shows a screen printed contact on the back surface of the solar cells fabricated on the silicon wafer.

Referring to FIG. 9, the next step is screen printing of contact 36 on the back surface of the solar cell. During this step the entire layer of the superfluous residual oxide on the back surface is dissolved by acid etching. Thereafter a paste, normally a mixture of aluminum and silver, is squeezed through the meshes of a screen to "screen print" the contacts on the back surface of the solar cell. Aluminum, the active metal in the mixture, dissolves through the back surface silicon and alloys thereto, leaving silver as the metal to be bonded to external wire leads. Because presence of aluminum oxide prohibits a strong electrical connection of aluminum with external wire leads, silver is used in the printing paste since, unlike aluminum, silver has good bonding characteristics with the bond wires connecting to the outside world.

After the screen printing of back surface contacts, the silicon wafer is sintered for a few minutes at elevated temperatures (but below 450° C., due to the presence of aluminium) to improve the ohmic contact between the topside and back surface metals and the silicon and to harden the metals. Screen printing of rear side ohmic contacts in accordance with the present invention is a much simpler process than the prior art method of using expensive masking technology and evaporating metals.

The present invention therefore discloses methods of very low cost, simple and high throughput manufacturing of silicon solar sells with efficiencies in the range of 18% to 20%. Because the present invention avoids highly sensitive processes its process leads to higher yields than the prior art processes. The low cost and high throughput methods of the present invention for mass production of silicon solar cells have not been previously achieved by the prior art.

While the present invention has been disclosed and described with respect to preferred embodiments thereof, it will be understood that the methods and structures of present invention may be varied without departing from the spirit and scope thereof.

I claim:

1. A method of fabricating a solar cell comprising the steps of:
   (a) providing a P type silicon wafer having a front surface and a back surface;
   (b) forming irregular structures on said front surface of said silicon wafer by anisotropical etching of said front surface;
   (c) carrying phosphorus atoms by an inert gas to said front surface of said silicon wafer, said silicon wafer having been heated to approximately 950° C.;
   (d) diffusing a layer of said phosphorus atoms under said front surface of said silicon wafer to form a lightly doped N type junction whereby a first P-N junction is formed in said wafer;
   (e) completing said diffusing step with a drive-in step whereby a stream of oxygen or steam is passed over said front surface of said silicon wafer, said silicon wafer having been heated to approximately 1100° C.;
   (f) thermally growing a layer of silicon dioxide on said front surface of said silicon wafer during said drive-in step of said diffusing step;
   (g) forming a plurality of grooves in said silicon dioxide on said front surface of said silicon wafer using a computer guided laser;
   (h) diffusing phosphorus atoms to form a heavily doped N type junction below said groove areas whereby a second P-N junction is formed in said wafer, said phosphorus atoms being carried by an inert gas over said front surface of said silicon wafer, said silicon wafer having been heated to approximately 950° C.;
   (i) depositing metallic layers in said groove areas to form electrical contacts with said front surface of said silicon wafer, said metallic layers being formed by chemically reducing metallic ions in a plating solution;
   (j) externally inducing an electric current to attract additional metallic ions to said metallic layers of step (i);
   (k) depositing an additional layer of metal on said metallic layers of step (i) by depositing molten metal thereon;
   (l) cleaning the edges of said first P-N junctions located at the edges of said silicon wafer by plasma etching; and
   (m) forming a plurality of electrical contacts with said back surface of said wafer,
   whereby said solar cell fabricated by said method has a light to electricity conversion efficiency of 18% to 20%.

2. The method of fabricating the solar cell of claim 1 wherein the wafer provided in step (a) is a Float Zone P type wafer.

3. The method of fabricating of the solar cell of claim 1 wherein said metallic layers of step (i) consist of gold and nickel and copper.

4. The method of fabricating the solar cell of claim 1 wherein the additional metallic ions of step (j) are gold or nickel or copper.

5. The method of fabricating the solar cell of claim 1 wherein said additional layer of metal of step (k) deposited on said metallic layers of step (i) is a layer of tin.

6. The method of fabricating the solar cell of claim 1 wherein any silicon dioxide layer formed on said back surface of said silicon wafer is removed by an acid solution and thereafter said electrical contact of step (m) is formed by alloying a first metal to said back surface of said solar cell wherein said first metal is electrically connected to a second metal and wherein said second metal is bonded to wires external to said solar cell.

7. The method of fabricating of the solar cell of claim 6 wherein said first metal is aluminum and said second metal is silver.

8. The method of fabricating the solar cell of claim 1 wherein the wafer provided in step (a) is a Czochralski P type silicon wafer.

9. A silicon solar cell comprising:
   a P type silicon wafer;
   a front surface of said wafer having irregularly etched structures thereon wherein said the reflectivity of said irregularly etched front surface is approximately 20%;
   a lightly doped N type junction on said front surface of said silicon wafer, said lightly doped N-type junction being doped with phosphorus atoms;
   a layer of silicon dioxide on said front surface of said silicon wafer;
   a plurality of grooves on said front surface of said silicon wafer;
   a heavily doped N type junction in said groove areas of said front surface of said silicon wafer;
   a plurality of metallic layers comprising nickel and gold and copper in said groove ares wherein said metallic layers are electrically connected with said front surface of said silicon wafer; and
   a plurality of electrical contacts comprising a first layer of aluminum and a second layer of silver formed on a back surface of said silicon wafer,
   whereby the light to electricity conversion efficiency of said silicon solar cell is approximately 18% to 20%.

10. The solar cell of claim 9 wherein said silicon wafer is a Float Zone P type wafer.

11. The solar cell of claim 9 wherein said silicon wafer is a Czochralski P type wafer.

* * * * *